United States Patent [19]

Fukuda et al.

[11] Patent Number: 5,198,392

[45] Date of Patent: Mar. 30, 1993

[54] METHOD OF FORMING A NITRIDED SILICON DIOXIDE ($SiO_xN_y$) FILM

[75] Inventors: Hisashi Fukuda; Tomiyuki Arajawa, both of Tokyo, Japan

[73] Assignee: OKI Electric Industry Co., Ltd., Tokyo, Japan

[21] Appl. No.: 718,792

[22] Filed: Jun. 21, 1991

Related U.S. Application Data

[63] Continuation-in-part of Ser. No. 613,988, Nov. 15, 1990, abandoned.

[30] Foreign Application Priority Data

Nov. 20, 1989 [JP] Japan .................................. 1-299546
Feb. 22, 1990 [JP] Japan .................................. 2-42203

[51] Int. Cl.⁵ .................................................. H01L 21/02
[52] U.S. Cl. ...................................... 437/241; 437/238; 437/235; 437/978; 148/DIG. 112; 148/DIG. 114
[58] Field of Search .............. 437/241, 238, 978, 235; 148/DIG. 112, DIG. 114

[56] References Cited

U.S. PATENT DOCUMENTS

| | | | |
|---|---|---|---|
| 4,435,447 | 3/1984 | Ito et al. | 437/241 |
| 4,438,157 | 3/1984 | Romano-Moran | 437/241 |
| 4,980,307 | 12/1990 | Ito et al. | 437/242 |

FOREIGN PATENT DOCUMENTS

| | | |
|---|---|---|
| 0154670 | 9/1985 | European Pat. Off. . |
| 0316835 | 5/1989 | European Pat. Off. . |
| 0229372 | of 1985 | Japan . |
| 0172339 | of 1986 | Japan . |

OTHER PUBLICATIONS

Fukuda et al., "Highly Reliable Thin Nitrided $SiO_2$ Films . . . in an $N_2O$ Ambient", The Japan Society of Applied Physics, Aug. 22–24, 1990.

Uchiyama et al., "High Performance Dual-gate Sub–Halfmicron CMOSFETs . . . in an $N_2O$ Ambient", The Japan Society of Applied Physics, Dec. 9–12, 1990.

Sundaresan et al., "Rapid-Thermal Nitridation of $SiO_2$ for Radiation-Hardened MOS Gate Dielectric"; IEEE Transaction vol. 33, No. 12, pp. 1223–1226, 1986.

Nemetz; "Thermal Nitridation of Si and $SiO_2$ for Thin Gate Insulators"; Solid State Tech., Part I; pp. 79–85; 1983.

Hori et al., "Electrical and Physical Characteristics of Thin Nitrided Oxides Prepared by Rapid Thermal Nitridation", IEEE Trans. on Elec. Dev; vol. ED-34; No. 11, pp. 2238–2245; Nov. 1987.

Ste; "VLSI Technology"; pp. 149–157.

Applied Physics Letters, vol. 47, No. 2, Jul. 1985, pp. 148–150; J. Nulman et al.: "Rapid Thermal Nitridation of Thin Thermal Silicon Dioxide Films"* Figure 1; p. 148, left-hand column, last paragraph—p. 149, left–hand column, paragraph 2*.

Idem Appl. Phys. A., vol. A-46, No. 4, Aug. 1988, pp. 255–273; M. M. Moslehi: "Single-Wafer Optical Processing of Semiconductors: Thin Insulator Growth for Integrated Electronic Device Applications" * p. 265, chapter 6.

M. R. Poponiak et al.: "Formation of Thick $Si_3N_4$ or $Si_xO_yN_z$ on Si Substrate by Anodnitridization"; IBM Technical Disclosure Bulletin, vol. 19, No. 3, Aug. 1976, p. 905.

*Primary Examiner*—Brian E. Hearn
*Assistant Examiner*—Trung Dang
*Attorney, Agent, or Firm*—Wenderoth, Lind & Ponack

[57] ABSTRACT

In a method of forming an insulating film, a silicon dioxide film is formed on a silicon substrate by performing heat treatment in an oxidizing gas atmosphere which does not contain nitrogen, and then the silicon dioxide film is oxynitrided by performing heat treatment in an nitrous oxide atmosphere. Prior to the formation of the silicon dioxide film, the silicon substrate is cleaned by heating it in a reducing gas atmosphere, and then heating it in a reactive gas atmosphere.

9 Claims, 6 Drawing Sheets

METHOD OF FORMING A NITRIDED SILICON DIOXIDE ($SiO_xN_y$) FILM

This application is a continuation-in-part of now abandoned application Ser. No. 07/613,988 filed Nov. 15, 1990, now abandoned.

FIELD OF THE INVENTION

This invention concerns a method of forming an insulating film, and in particular a method of forming a high quality insulating film of very small thickness.

BACKGROUND OF THE INVENTION

In silicon integrated circuits and in particular in MOS (Metal Oxide Semiconductor) integrated circuits formed by modern techniques, very thin silicon dioxide films are used as gate insulators. For sub-micron MOS devices which have gate lengths of 1.0 $\mu m$ or less, the silicon dioxide film may for example be no more than 100 angstroms thick, this reduction in film thickness permitting an increase in gain.

These silicon dioxide films may for example be formed by the following method which is described in "The Manufacture of MOSLSI", by Tokuyama and Hashimoto, published by Nikkei McGraw Hill Co., p. 65 (1985).

According to the method disclosed in this reference, a cleaned substrate is first placed in a quartz tube heated to 800°-1200° C. by an electric furnace, and an oxidizing gas is then introduced into the tube to form a silicon dioxide film on the substrate. This oxidizing gas may for example be dry oxygen, or a mixture of oxygen and hydrogen, or hydrochloric acid spray mixed with oxygen. By leaving the substrate in the quartz tube containing an oxidizing gas at a certain temperature for a time depending on the thickness of the silicon dioxide film it is desired to obtain, it is thus possible to form a film of uniform thickness on the substrate surface.

In the method of forming an insulating film by the method of the above reference, however, it was difficult to control film thickness if it was desired to form a silicon dioxide film of for example no more than 100 angstroms. When forming thin silicon dioxide films by the conventional film forming techniques, therefore, it was necessary to keep the heating temperature of the quartz tube below 800° C. (hereafter, this may be referred to as the low temperature oxidation method), or to dilute the oxygen with nitrogen to decrease the rate of oxidation (hereafter, this may be referred to as the dilution oxidation method).

In the low temperature oxidation method, however, the silicon (substrate)/silicon dioxide film interface obtained is coarser (with silicon atoms protruding and the surface undulating). In the dilution oxidation method, on the other hand, nitrogen segregates at the silicon/silicon dioxide film interface, and a new interface trap state is generated. Further, the silicon dioxide films obtained in the low temperature method or the dilution method are usually not very fine. At the silicon/silicon dioxide interface, there may for example be a large number of unterminated silicon bonds or strained Si—O—Si bonds, and the interface trap state therefore showed a tendency to increase. These phenomena gave rise to various problems when the silicon dioxide films were used as gate insulating films in MOS field effect transistors. In MOS field effect transistors with a gate length of 1 $\mu m$ or less, for example, if hot electrons produced in the channel penetrated into the silicon dioxide film, the electrons were trapped by the unterminated silicon bonds or strained Si—O—Si bonds, and a new interface trap state was generated. This led to a fluctuation of the threshold voltage, or a decline of the transconductance in MOS field effect transistors. Further, in dielectric breakdown endurance tests of various MOS devices using this kind of silicon dioxide film, new traps were generated in the film due to breaking of the unterminated silicon bonds or strained Si—O—Si bonds, and this caused dielectric breakdown.

SUMMARY OF THE INVENTION

This invention therefore aims to provide a method of forming a thin insulating film whose thickness can be controlled easily, which has excellent dielectric breakdown endurance (strength), and which has good film properties.

A method of forming an insulating film on a silicon substrate according to the invention comprises:

the step of forming a silicon dioxide film on said silicon substrate by performing heat treatment in an oxidizing gas atmosphere which does not contain nitrogen; and the step of oxynitriding the silicon dioxide film, by performing heat treatment in an atmosphere which contains nitrous oxide.

The substrate referred to here is a substrate in the wide sense of the term, and apart from a silicon substrate it may also consist of an epitaxial layer on a substrate, or a semi-finished product wherein other devices have been formed in a substrate or an epitaxial layer.

The silicon substrate may be cleaned by heating in a reducing gas atmosphere and then in a reactive gas atmosphere, prior to the actual formation of the insulating films.

Further, in this invention, it is preferable that said heating in an insulating film forming gas atmosphere and heating in a reducing gas atmosphere are carried out by infra-red irradiation.

In this invention, a silicon dioxide film is formed on a substrate using a oxidizing gas which does not contain nitrogen, and the silicon dioxide film is then oxynitrided by heating the silicon dioxide film in an atmosphere containing nitrous oxide ($N_2O$), thereby to form an oxynitrided silicon film. The resultant oxynitrided silicon film is thicker than the silicon dioxide film. Moreover, nitrogen is piled up or segregates at the substrate/insulating film interface.

In this composition, the oxynitrided silicon dioxide ($SiO_xN_y$) film contains several atomic % of nitrogen. These nitrogen atoms are dispersed uniformly (in the directions parallel with the surface of the film) its in the oxynitrided silicon dioxide and silicon dioxide films, and act upon unterminated silicon bonds at the $SiO_xN_y/Si$ interface, and strained Si—O—Si bonds in the film so as to form Si—N bonds and O—N bonds. This contributes to the reduction of said unterminated bonds.

Further, when the silicon substrate is first cleaned by heating it in a reducing gas atmosphere, the native oxide film on the substrate is thereby reduced. Next, the substrate is heated in a reactive gas. In this process, the reactive gas is thermally activated, and reacts with impurities present on the substrate so as to volatilize them.

Further, if the heating of the substrate in a reducing gas atmosphere and in an insulating film forming gas atmosphere are carried out by infra-red irradiation, the heating and cooling of the substrate can be made with a rapid response. As a result, the precise thickness control can be accomplished in an angstrom order.

DETAILED DESCRIPTION OF THE PREFERRED EMBODIMENTS

We shall now describe some embodiments of the insulating film forming method of this invention with reference to drawings.

The drawings show the dimensions, shapes and positions of the components to the extent that is necessary to understand the invention, and the invention is not limited to these dimensions, shapes and positions. Further, in the following description, specific materials and specific numerical conditions are mentioned, but it should be understood that these are only preferred embodiments and the invention is not limited to these materials and conditions.

Insulating Film-Forming Apparatus

Before describing the insulating film-forming method of this invention, we shall describe a preferred apparatus used to implement it.

Figure 1:
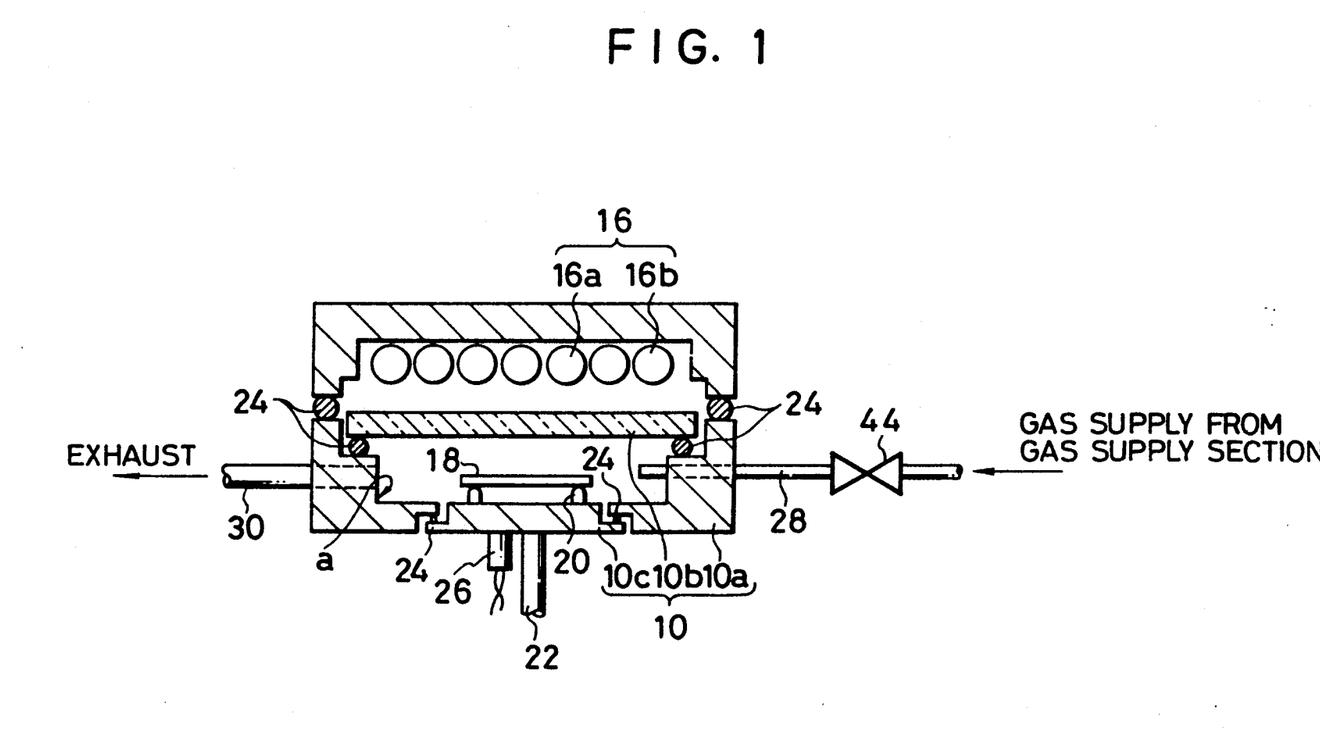
FIG. 1 is an explanatory diagram of this embodiment and is a sectional view showing the main part of the apparatus preferred in implementing the insulating film forming method.

FIG. 1 is a schematic sectional view of the main parts of this insulating film-forming apparatus (mainly the reaction chamber and the heating member). FIG. 1 shows the substrate installed in the reaction chamber.

Figure 2:
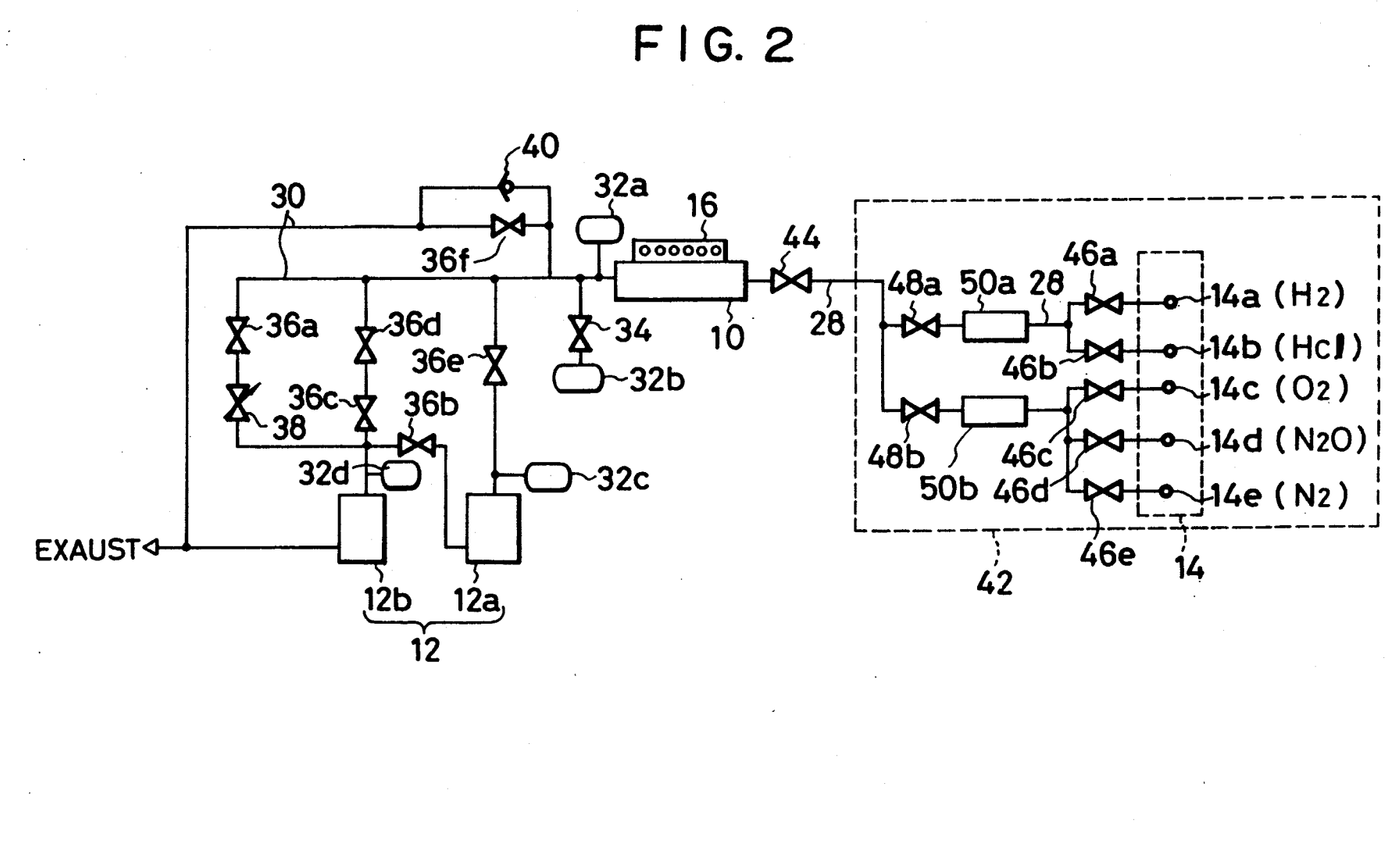
FIG. 2 is an explanatory diagram of this embodiment and is a diagram showing overall structure of the apparatus preferred for implementing the insulating film forming method.

FIG. 2 is a schematic view of the whole structure of the insulating film-forming apparatus.

As shown in FIG. 1, in this embodiment, reaction chamber 10 comprises for example a body 10a, a lid 10b and a lift platform 10c. The material of body 10a and of lift platform 10c may for example be stainless steel, while the material of lid 10b and supports 20 (described later) may for example be quartz.

Body 10a and lift platform 10c fit together to form the recess "a" shown in the figure. Supports 20 to mount substrate 18 are installed on the lift platform 10c of recess "a", the substrate 18 being inserted in or withdrawn from chamber 10 on supports 20 by the action of lift platform 10c. In the embodiment shown in the figure, lift platform 10c is connected to a lifting device 22 which raises and lowers lift platform 10c, for example, mechanically.

Lid 10b fits on body 10a such that it can be freely attached or detached. Seals 24, for example bite-on packing, are provided between body 10a, and lid 10b and lift platform 10c, and sealtightness can therefore be maintained in chamber 10 when it is evacuated.

A means 26 of measuring the surface temperature of substrate 18, for example an optical pyrometer, is installed in recess "a" near the substrate.

Further, in this embodiment, heating member 16 is a means of infra-red irradiation of suitable construction, and may for example comprise a set of infra-red lamps 16a supported on a support 16b. Infra-red lamps 16a may be tungsten halogen lamps or other preferred lamps. It is preferable to install a plurality of lamps so that chamber 10 can be heated uniformly. Infra-red lamps 16a are normally installed outside chamber 10. In this case, part of chamber 10 is constructed of a material which allows infra-red radiation to pass into the chamber from outside it. In this embodiment, lid 10b is made of quartz as already explained, and it therefore permits transmission of infra-red radiation.

Although the position of support 16b of infra-red lamps 16a is not limited to this arrangement, in the embodiment shown, support 16b is mounted to body 10a in such a manner that it can be attached and removed, such that the portion of abutment between lid 10b and body 10a is enclosed between support 16b and body 10a, and seals 24 are provided between support 16b and body 10a. The provision of support 16b therefore improves the vacuum sealtightness of chamber 10.

In FIG. 1, 28 is a gas supply duct between chamber 10 and gas supply section 14 (see FIG. 2), and 30 is an exhaust duct between chamber 10 and exhaust means 12.

Next, we shall describe the vacuum exhaust system and gas supply system in this embodiment, but it should be understood that these systems are not limited to those in the following description.

First, we shall explain the vacuum exhaust system. In this embodiment, exhaust means 12 may comprise for example a turbo-molecular pump 12a and a rotary pump 12b connected to pump 12a. Exhaust means 12 is connected to reaction chamber 10 via, for example, an exhaust duct 30 and valves arranged as shown in the diagram.

In FIG. 2, 32a–32d are vacuum gauges (or pressure gauges) connected to exhaust duct 30. Vacuum gauges 32a and 32d may for example be Varatron gauges (or Pirani vacuum gauges) used for measuring pressures in the range $1-10^{-3}$ Torr, while vacuum gauges 32b and 32c may for example be ion gauges used for measuring pressures in the range $10^{-3}-10^{-8}$ Torr. An automatic valve 34 is provided between vacuum gauge 32d and exhaust duct 30 to protect vacuum gauge 32b, and the opening and closing of valve 34 is controlled automatically such that a pressure greater than $10^{-3}$ Torr does not act on gauge 32b when the gauge operates. 36a–36f are automatic valves installed between exhaust means 12 and reaction chamber 10, and the pressure in chamber 10 is suitably controlled to create a high or low level of vacuum by opening and closing these valves 36a–36f as appropriate.

38 is a pressure regulating needle valve and 40 is a relief valve. Valve 40 opens automatically if the pressure in chamber 10 exceeds atmospheric pressure, for example 760 Torr, and gas supplied from gas supply section 14 to chamber 10 is evacuated by the opening of this valve.

We shall now describe the gas supply system. In this example, gas supply section 14 comprises a reducing gas source 14a, a reactive gas source 14b, a oxidizing gas (O$_2$) source 14c which in this case is O$_2$ gas source, a oxynitriding gas source 14d which in this case is N$_2$O gas source, and an inert gas source 14e. Gas supply section 14 is connected to chamber 10 via a supply duct 28 and valves installed as for example shown in the diagram.

In FIG. 2, 42 is a gas supply system, 44 is a valve, 46a–46e and 48a, 48b are automatic valves, and 50a, 50b are automatic flowrate controllers for the gases which are led from gas supply section 14 to the reaction chamber.

The desired gas can be introduced from gas supply section 14 to reaction chamber 10 by opening and closing valves 44, 48a, 48b and 46a–46e as appropriate.

Insulating Film Forming Method

Figure 5:
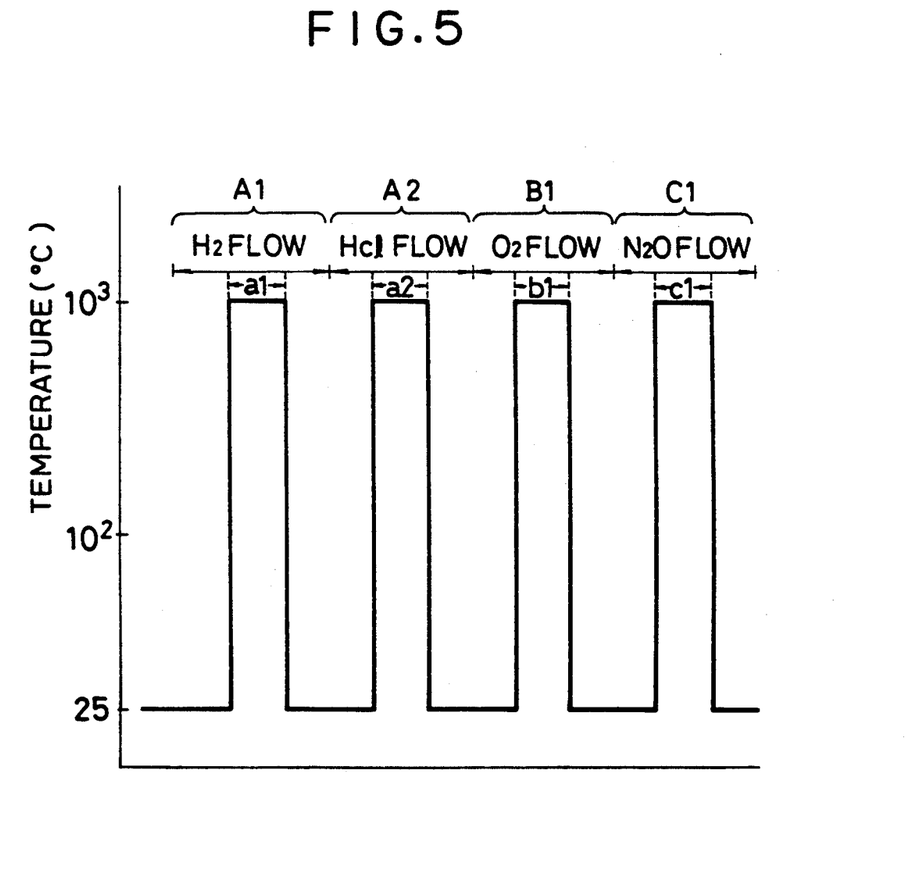
FIG. 5 is a diagram showing the heat cycle carried out in the insulating film forming method of this embodiment.

We shall next describe an embodiment of the insulating film forming method of this invention where the insulating film is formed on a silicon substrate. FIG. 3A–FIG. 3D are diagram showing the process steps to assist understanding of the film forming method of this embodiment, and are sectional views of the sample during the main process steps illustrating the sections along the thickness direction of the silicon substrate. FIG. 5 is a drawing to illustrate the heating cycle in the film forming process of this embodiment. In FIG. 5 the horizontal axis is time, and the vertical axis is temperature.

Further, in the following description, we shall also refer to FIG. 1 and FIG. 2 where convenient.

In this embodiment, after installing silicon substrate 18 (referred to hereafter as substrate 18) in reaction chamber 10, the substrate is subjected to preliminary treatment, removal of native oxide and cleaning before the actual formation of an insualting film. We shall therefore first describe the cleaning process.

Preliminary Treatment

In this embodiment of the invention, substrate 18 is cleaned with chemicals, pure water, or the like.

Next, an inert purge gas, for example nitrogen, is introduced into chamber 10 to prevent the formation of a native oxide film on substrate 18. The reducing gas, reactive gas and oxidizing gas are not yet introduced into the chamber, so valves 44, 48b and 46e are open, while valves 48a and 46a–46d are shut.

Next, substrate 18 is installed in chamber 10. The substrate 18 is fixed on the supports 20 of lift platform 10c.

After these preliminary treatments have been completed, the surface of the substrate is cleaned.

Removal of Native Oxide Film

Figure 3A:
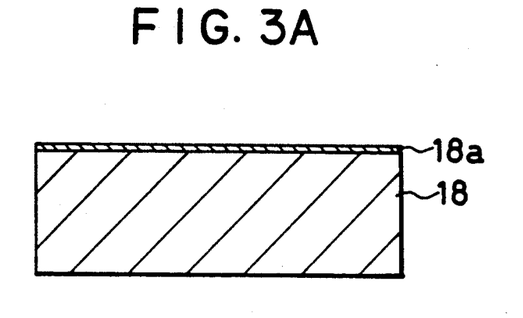
FIG. 3A to FIG. 3D are diagrams showing process steps of forming an insulating film according to the embodiment.

As described above, when silicon substrate 18 is installed in chamber 10, care is taken to minimize the formation of a native oxide film, but despite these precautions such a film is nevertheless often formed on the substrate surface. FIG. 3A shows this situation, the native oxide film being denoted by 18a. In this embodiment, therefore, the native oxide film 18a is removed as described below.

To clean substrate 18, valves 44, 48b and 46e are shut, and the supply of inert gas 14e to substrate 18 installed in chamber 10 is stopped.

Furnace 10 is then evacuated to a high vacuum of for example, $1 \times 10^{-6}$ Torr by exhaust means 12 so as to clean the interior. To apply this vacuum, valves 38, 36a, 36f and 34 are shut, valves 36b, 36c and 36d are opened, and rotary pump 12b is actuated while monitoring the pressure inside chamber 10 on vacuum gauge 32a. When the pressure inside chamber 10 has reached $1 \times 10^{-3}$ Torr, valves 36c and 36d are shut, valves 36e and 34 are opened, and the chamber is evacuated to $1 \times 10^{-6}$ Torr while monitoring the pressure on vacuum gauge 32b.

After chamber 10 has been placed under high vacuum, a reducing gas 14a, for example hydrogen, is introduced (Period A1 in FIG. 5). When the reducing gas 14a is introduced into the chamber, valves 36b, 36e and 34 are shut, and valves 38 and 36a are opened to maintain a reduced pressure.

The maintenance of a reduced pressure in chamber 10 while introducing reducing gas 14a is achieved by manipulating valve 38, and adjusting the flowrate of gas 14a with automatic controller 50a. In this way, chamber 10 can be maintained under a low vacuum of $1 \times 10^2$–$10^{-2}$ Torr.

Next, heating is carried out by heating member 16 (Period a1 in FIG. 5). In this process, substrate 18 is heated in the reducing gas atmosphere, and the native oxide on the substrate is thereby reduced and removed from it. The heating of substrate 18 may be carried out for example by a means of infra-red irradiation. By carrying out the heating while the chamber is maintained under reduced pressure, the contamination of substrate 18 and chamber 10 by the reaction products of the reduction of the native oxide film is lessened.

In this heating process, the surface temperature of substrate 18 is controlled such that it increases at a suitable rate of from 50° C./sec–200° C./sec, and preferably at a rate of approx. 100° C./sec, by monitoring it with means 26. When the temperature has reached approx. 1000° C., it is maintained at that level for approx. 10–30 sec.

The heating of substrate 18 by heating member 16 is then stopped, valve 46a is shut, the supply of reducing gas is stopped, and the surface temperature of substrate 18 is allowed to cool to room temperature, for example 25° C. The substrate may be allowed to cool naturally. The cooling may also be forced by closing valve 14a, opening valves 48b and 46e, and introducing a large volume of inert gas 14e into chamber 10.

Next, valves 38 and 36a are shut, valves 36b and 36e are opened, and chamber 10 is evacuated to a high vacuum of, for example, $1 \times 10^{-6}$ Torr in order to clean the interior.

Cleaning of Substrate Surface

Valves 36b and 36e are shut, valves 38 and 36a are opened, and a reactive gas 14b, prepared for example by mixing 1 weight % of hydrogen chloride and 99 weight % of hydrogen is introduced into the chamber (Period A2 in FIG. 5: HCl flow).

When the reactive gas is introduced, chamber 10 is maintained under reduced pressure, for example a low vacuum of $1 \times 10^2$–$10^{-2}$ Torr, as in the case of heating in the reducing gas atmosphere 14a.

Figure 3B:
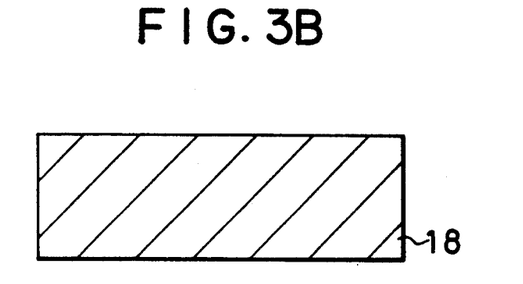

Next, the substrate is heated by heating member 16 (Period a2 in FIG. 5). In this process, thermally activated reactive gas 14b reacts chemically with substrate 18 and its impurities so as to volatilize them, and inorganic matter and other impurities adhering to substrate 18 are thereby removed (FIG. 3B). The thermal activation of reactive gas 14b may be carried out for example by irradiating it with infra-red radiation. The heating is carried out while maintaining chamber 10 under reduced pressure, so volatile reaction products generated by etching substrate 18 are evacuated from the chamber, and the contamination of substrate 18 and chamber 10 by these reaction products is thereby lessened. Etching of substrate 18 by reactive gas 14b may for example be carried out for approx. 20 seconds while heating the substrate so that its surface temperature is maintained at approx. 1000° C.

The heating by heating member 16 is then stopped, valve 46b is shut, the supply of reactive gas 14b is stopped, and the substrate 18 is allowed to cool to room temperature. This cooling may be a natural cooling, or it may be forced.

Next, valves 38 and 36a are shut, valves 36b and 36e are opened, and chamber 10 is evacuated to a high vacuum of for example $1 \times 10^{-6}$ Torr.

Formation of Silicon Dioxide Film

Figure 3C:
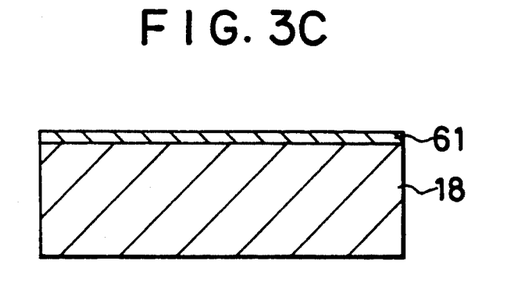

Next, a silicon dioxide film is formed on substrate 18 by heating it in an oxidizing gas atmosphere not containing nitrogen. For this purpose, valves 36b and 36e are closed, valves 38, 36a, 48b and 46c are opened, and an oxidizing gas which is oxygen in this embodiment, is supplied to chamber 10 (Period B1 in FIG. 5: $O_2$ flow). The formation of this silicon dioxide film may be carried out under atmospheric pressure, but in order to evacuate the reaction products from chamber 10 when the film is formed, the chamber is maintained under a low vacuum, for example $100-10^{-2}$ Torr. Substrate 18 is then heated by heating member 16. More specifically, the temperature of substrate 18 is increased at a suitable rate of between 50° C./sec–200° C./sec and preferably at a rate of 100° C./sec while monitoring substrate surface temperature with temperature measurement means 26, and its temperature is then maintained at approx. 1000° C. for approx. 20 sec (Period b1 in FIG. 5). It is preferable to carry out this heating so that the rate of temperature increase is constant. The growth rate of the silicon dioxide film is then constant and a high quality film is obtained. By heating the substrate under these conditions, a silicon dioxide film 61 of thickness approx. 50 angstroms is formed (FIG. 3C). The thickness of the insulating film may be controlled, for example, by adjusting the oxidation temperature, oxidation time and $O_2$ gas flowrate.

Oxynitridation of the Silicon Dioxide Film

Next, the oxygen used as a film forming gas is replaced by a $N_2O$ gas so as to oxynitride the silicon dioxide film 61. In this embodiment, the procedure described below is adopted.

First, infra-red lamps 16a are switched off, and the heating of substrate 18 is stopped. Next, valves 38 and 36a are shut, valves 36b and 36e are opened, and chamber 10 is evacuated to a high vacuum of for example $1 \times 10^{-6}$ Torr.

Valves 36b and 36e are then shut, valves 36a, 38, 48b and 46d are opened, and a $N_2O$ gas which in this embodiment is nitrous oxide ($N_2O$) is supplied to chamber 10 (Period C1 in FIG. 5: $N_2O$ flow). In this operation, it is preferable to maintain chamber 10 under reduced pressure so that reaction products generated in the subsequent heating process can be efficiently removed from the chamber. A reduced pressure is maintained in the chamber by operation of valve 38 while introducing $N_2O$ gas, and adjusting the flowrate of $N_2O$ gas by means of automatic controller 50a. In this embodiment, the chamber is maintained under a low vacuum of for example, $100-10^{-2}$ Torr.

It is also possible to continue the heating of the substrate after the silicon dioxide film has been formed and while the oxidizing gas is replaced by the $N_2O$ gas. But if the final film thickness desired is of the order of no more than 100 angstroms, there is a high risk that film growth will continue and the final thickness will be reached during gas replacement. In this embodiment, therefore, the gas is replaced after heating of the substrate has been stopped, and it is ensured that the heating is commenced after the $N_2O$ gas is introduced into the chamber 10, and hence is brought into contact with the silicon dioxide film 61 on the substrate 18.

Figure 3D:
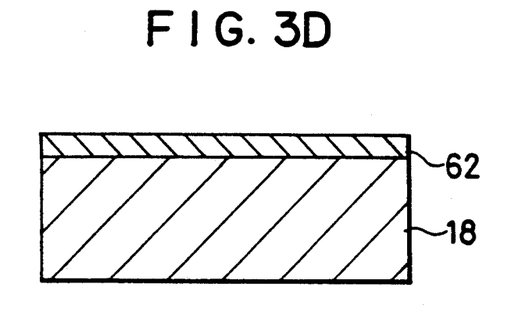

Next, infra-red lamps 16a are switched on, and substrate 18 which already has a silicon dioxide film is heated in the $N_2O$ atmosphere. More specifically, the temperature of substrate 18 is increased at a rate of 100° C./sec while monitoring substrate surface temperature with measurement means 26, and its temperature is then maintained at approx. 1000° C. for approx. 10–30 sec (Period c1 in FIG. 5). By heating the substrate under these conditions, an oxynitrided silicon dioxide 62 ($Si-O_xN_y$ where X and Y>0) of thickness approx. 100 angstroms is formed on the substrate 18 (FIG. 3D). In other words, the silicon dioxide film 61 formed by the previous step is converted into the oxynitrided silicon dioxide film 62. The thickness of the oxynitrided silicon dioxide film 62 may be controlled by adjusting for example oxidation temperature and time, oxidation time and oxynitridation temperature and time.

When the oxynitridation of the silicon dioxide film is completed, heating of substrate 18 is stopped.

At the same time or after the heating is stopped, valve 46d is shut and the supply of $N_2O$ gas is stopped.

When an insulating film of desired thickness has been formed, the heating by infra-red lamps 16a is stopped, and valve 46e is opened to introduce for example nitrogen gas to prevent further growth of the film. By introducing the inert gas, the film is prevented from growing to more than the required thickness.

Next, substrate 18 is cooled to room temperature, for example 25° C. When the substrate has reached room temperature, it is removed from chamber 10.

Figure 6:
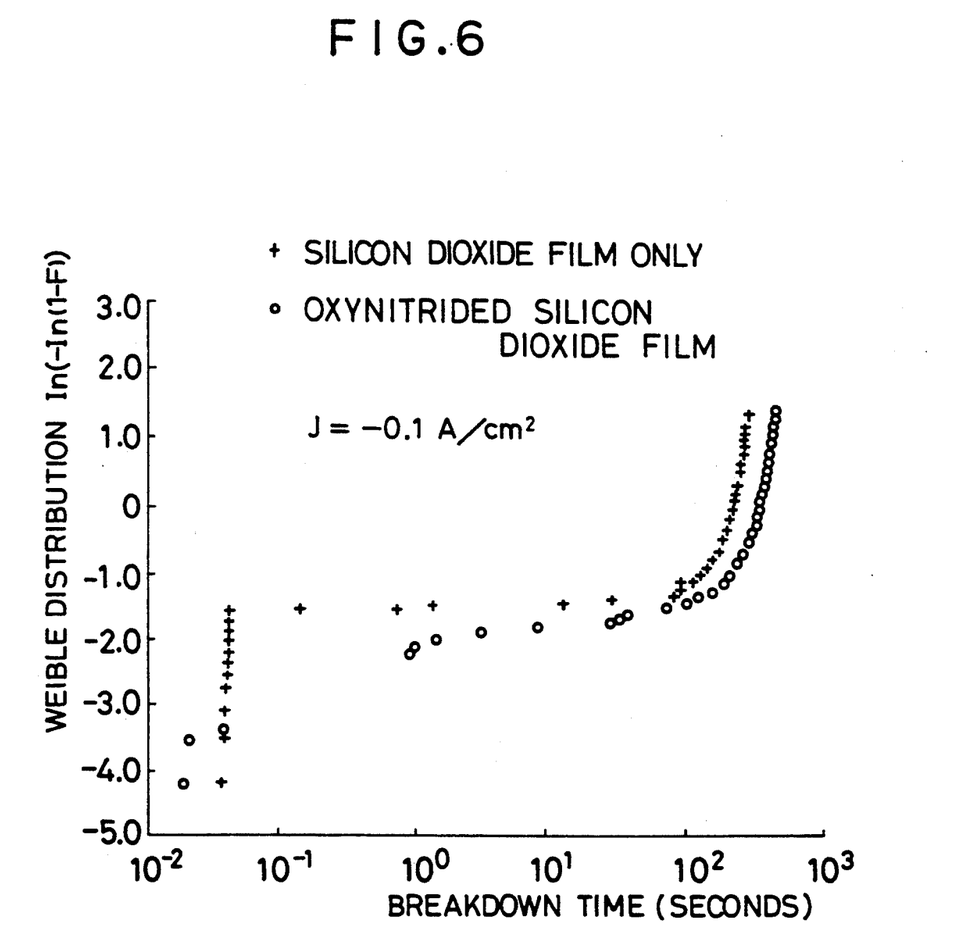
FIG. 6 is a breakdown time—Weible distribution graph obtained used for implementing the invention.

A TDDB (Time-Dependent Dielectric Breakdown) test was performed to investigate dielectric breakdown properties. TDDB is a measure of the fatigue due to electrical stress or the dielectric breakdown which occurs when a given field is applied for a long period of time. The TDDB test is applied to a silicon dioxide film and to the oxynitrided silicon dioxide film formed according to the invention. The results are shown in FIG. 6. It is seen that the dielectric breakdown strength of the oxynitrided silicon dioxide film is higher than silicon dioxide film.

Figure 4A:
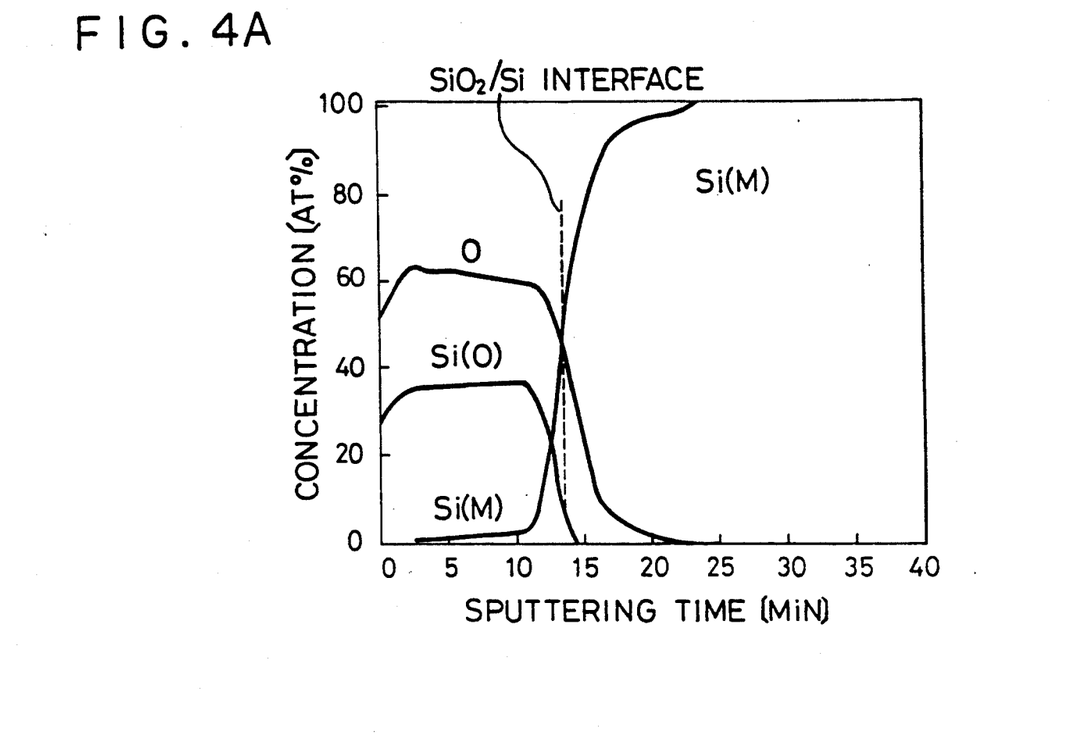
FIG. 4A and FIG. 4B respectively show the depth profiles of nitrogen (N), Silicon (Si(M), Si(O)) and hydrogen (H) atoms in an $SiO_2$ film and $SiO_xN_y$ films measured by AES (Auger Electron Spectroscopy).
Figure 4B:
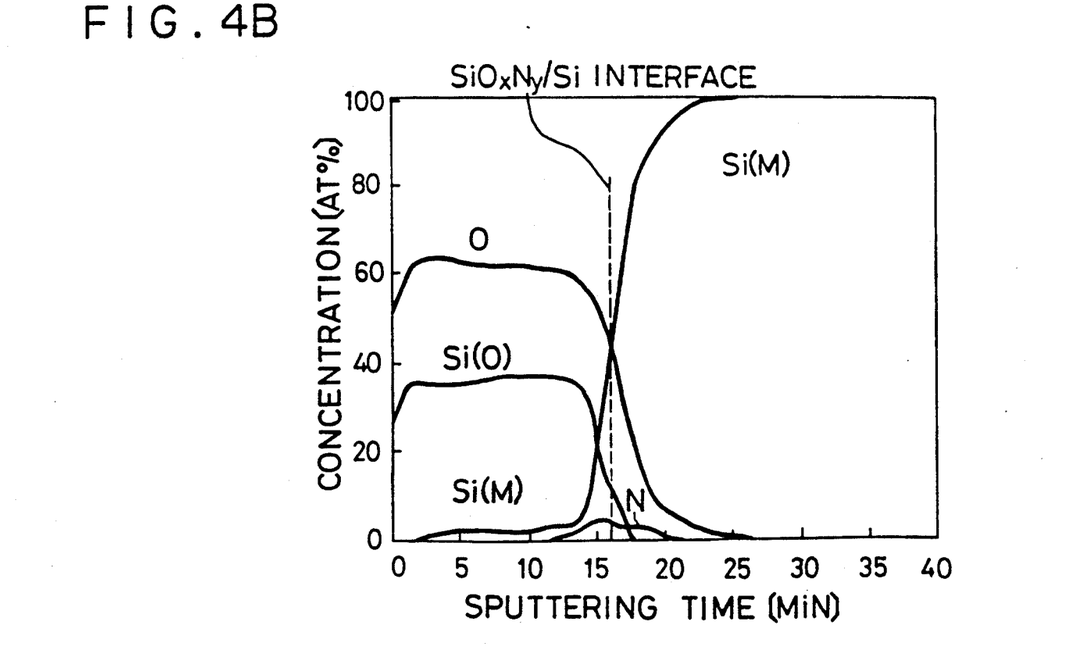

FIG. 4A and FIG. 4B respectively show the depth profiles of nitrogen (N), silicon (Si(O), Si(M)) and hydrogen (H) atoms for silicon dioxide film and oxynitrided silicon dioxide film measured by AES (Auger Electron Spectroscopy). In the figures, Si(O) stands for concentration of silicon atoms in oxides or oxynitrided oxide, while Si(M) stands for concentration of silicon atoms in crystalline silicon structure. In the AES, the surface of the film or layer is analyzed while the film is etched by sputtering, so the sputtering time corresponds to the depth of the film. The etching rate used in the experiment is 6.9 angstroms per minute.

As illustrated, an accumulation of N atoms of about 5 atomic % is found at the $SiO_xN_y$/Si interface of the oxynitrided silicon dioxide film. The incorporated nitrogen (N) atoms act on the unterminated silicon bonds and/or the strained Si—O—Si bonds so as to form a strong Si—N and O—N bonds at the $SiO_xN_y$/Si interface, and in the bulk $SiO_2$ film.

When the TDDB test was applied to the insulating films, a large amount of electron and hole traps are generated in the films. The oxynitrided silicon dioxide film produces Si—N and O—N bonds and can minimize the trap generation, resulting in a longer breakdown time in the TDDB tests. The silicon dioxide film which is not oxynitrided does not have such functions.

In the above description, we have described one embodiment of the insulating film forming method of this invention, but this invention is not limited to this embodiment and various modifications are possible as described below.

In the above embodiment, heating of the substrate is carried out by infra-red lamps, but it may also be carried out by an arc lamp, a laser beam, a heater or the like.

It is also clear that the insulating film forming method of the above invention will provide an improved film quality even when it is applied to low temperature oxidation.

Further, in the above embodiment, $O_2$ was used as the oxidizing gas and $N_2O$ as the nitrogen containing gas, but other gases producing similar results may be used as the gases for the oxidation and the oxynitridation. Specifically, $N_2O$ (nitrous oxide) containing gas other than the gas consisting of $N_2O$ may be used for the oxynitridation.

Further, in the above embodiment, heating in a reducing gas atmosphere to clean the substrate is carried out prior to forming the insulating film, but this step may of course be omitted depending on the design of the apparatus.

Further, by heating the substrate in a reducing gas atmosphere and in a reactive atmosphere before forming an insulating film, the native oxide film on the substrate is removed, and the insulating film is formed on a clean substrate.

Further, by using infra-red lamps to heat the substrate in an atmosphere of insulating film forming gas, the substrate responds rapidly to heating and cooling. Even if the insulating film is formed under high temperature conditions, therefore, it is easy to start and stop film growth, and a thin film of superior quality can be obtained.

What is claimed is:

1. A method of forming an insulating film on a silicon substrate comprising:
    the step of forming a silicon dioxide film on said silicon substrate by performing heat treatment in an oxidizing gas atmosphere which does not contain nitrogen; and
    the step of oxynitriding the silicon dioxide film, by performing heat treatment in an atmosphere which consists essentially of nitrous oxide.

2. The method of claim 1, further comprising the step of cleaning said silicon substrate by heating it in a reducing gas atmosphere, and then heating it in a reactive gas atmosphere, prior to said steps of forming a silicon dioxide film on said substrate and an oxynitrided silicon dioxide film.

3. The method of claim 1, wherein said heating is carried out by infra-red irradiation.

4. The method of claim 1, wherein the heating of said step of oxynitridation is commenced after the nitrogen oxide containing gas is brought into contact with the silicon dioxide film on the substrate.

5. The method of claim 1, wherein said step of forming the silicon dioxide film is continued until the silicon dioxide film is formed to a thickness of about 50 angstroms.

6. The method of claim 5, wherein said step of oxynitridation forms an oxynitrided silicon dioxide film of about 100 angstrom thick.

7. The method of claim 1, wherein, during said step of forming the silicon dioxide film, the rate of temperature increase is substantially constant.

8. The method of claim 7, wherein the temperature is increased up to about 1000° C. during said step of forming the silicon dioxide film.

9. The method of claim 1, wherein the temperature is increased up to about 1000° C. in said step of oxynitridation.

* * * * *

UNITED STATES PATENT AND TRADEMARK OFFICE
CERTIFICATE OF CORRECTION

PATENT NO. : 5,198,392

DATED : March 30, 1993

INVENTOR(S) : Hisashi FUKUDA and Tomiyuki ARAKAWA

It is certified that error appears in the above-identified patent and that said Letters Patent is hereby corrected as shown below:

On the title page:
Section [75], change "Arajawa" to --Arakawa--.

Signed and Sealed this

Twenty-ninth Day of March, 1994

Attest:

BRUCE LEHMAN

*Attesting Officer*     *Commissioner of Patents and Trademarks*